United States Patent [19]
Bonfiglio et al.

[11] 3,768,155
[45] Oct. 30, 1973

[54] METHOD OF MAKING EPOXY TUNNEL STRUCTURE FOR PLATED WIRE MEMORIES

[75] Inventors: Guy P. Bonfiglio, Stow; Joseph P. Farris, Chelmsford, both of Mass.

[73] Assignee: The United States of America as represented by the Secretary of the Navy, Washington, D.C.

[22] Filed: Aug. 11, 1972

[21] Appl. No.: 280,005

[52] U.S. Cl. .............. 29/604, 264/313, 340/174 PW
[51] Int. Cl. .............................................. H01f 7/06
[58] Field of Search ............... 29/604; 340/174 MA, 340/174 PW; 264/313, 317; 156/155

[56] References Cited

UNITED STATES PATENTS 3,534,343 10/1970 Sallet .......................... 340/174 PW
3,653,121 4/1972 Moriyama ............................ 29/604
3,513,538 5/1970 Bryzinski ............................ 29/604

*Primary Examiner*—Charles W. Lanham
*Assistant Examiner*—Carl E. Hall
*Attorney*—R. S. Sciascia et al.

[57] ABSTRACT

A process for fabricating a memory plane for a plated wire memory stack is provided. A plurality of tunnel-forming wires coated with lubricant are straightened under tension and deployed over a bottom sheet of epoxy material. The sheet is covered with epoxy resin up to the wires and strips of epoxy material are then placed over the bottom sheet to either side of the wires to define wire array cavities. Additional epoxy resin is then applied filling the cavities and covering the strips after which a top sheet of epoxy is laid down. After the assembly is cured, the tunnel-forming wires are withdrawn and plated wires are inserted into the resultant holes in the word pack.

12 Claims, 11 Drawing Figures

METHOD OF MAKING EPOXY TUNNEL STRUCTURE FOR PLATED WIRE MEMORIES

The present invention concerns memory devices and, more particularly, a method of constructing a tunnel for plated wires in subject devices.

The present invention is directed to the method of fabricating a laminated memory plane for a plated wire memory stack wherein the memory plane includes a longitudinally extending series of uniformly spaced coated wires. Conventionally, memory planes of this type comprise a laminated structure having an intermediate layer of dielectric material wherein the magnetically coated wires extend longitudinally through uniformly spaced holes or tunnels. Respective sheets of dielectric material are bonded to opposing planar surfaces of the intermediate layer, each sheet having a transversely disposed series of uniformly spaced conductors plated on its exposed surface. Disposed in each end portion of a transversely disposed conductor is a respective plated through-hole which extends insulatingly through the intermediate layer and connects to an aligned end portion of a corresponding conductor on the opposing dielectric sheet. Thus, the transversely disposed conductors are formed into loops which insulatingly encircle the longitudinally extending wires in the manner desired.

Usually, the intermediate layer of dielectric material is molded with tooling wires in the longitudinally extending holes, and the tooling wires are coated with a releasant which permits ready removal of the wires when desired. With the tooling wires still disposed in the holes, the dielectric sheets are bonded to respective opposing surfaces of the intermediate layer and the through holes are drilled. Subsequently, the assembly is cleaned, usually by immersing it in one or more cleaning fluids, and then it is baked-out at an elevated temperature. After cooling, the through-holes are plated by means of a conventional plating process.

It has been found that during the lamination process, air becomes occluded between the dielectric sheets and the intermediate layer. Furthermore, during cleaning, fluid may seep into some of the occluded air pockets. As a result, during bake-out, the expanding gases and vapors in these air pockets may cause bubbles to appear under the dielectric sheets and may even cause a dielectric sheet to rupture. Moreover, the intermediate layer may be made of a smooth, easily flowing material, such as polyimide, for example, which smears over the end apertures of the through holes during drilling and prevents the plating material from adhering uniformly to the surrounding walls of the through holes.

The present invention avoids the deficiencies and disadvantages of prior methods of fabricating memory planes by providing a process for fabricating an integral memory plane made of homogeneous dielectric material which can be uniformly baked-out and readily drilled to accommodate fastenings and other appendages. The invention comprises, in general, laying a first epoxy sheet on a rigid flat surface, coating a plurality of firmly rigid wire segments each longer than the epoxy sheet with silicon grease, supporting an array of the coated wires appropriately spaced above the first epoxy sheet, coating these supported wires with Teflon, placing shallow boards between and at the ends of sections of parallel wires, pouring a two-part liquid epoxy resin over the supported wires and filling the space between the epoxy boards to the upper surfaces thereof, placing another epoxy sheet on the upper surface of the epoxy boards, curing the liquid epoxy under pressure at elevated temperature, and trimming the excess epoxy from the cured assembly.

Accordingly, it is an object of the present invention to provide a method of fabricating an integral memory plane made of homogeneous dielectric material which avoids the formation of undesirable bubbles and the occurrence of rupturing during the performance of the method, and the product made according to this method.

Another object of the invention is to provide a method of making a memory storing device which uses plated wires wherein liquid epoxy is used without affecting the plating of the memory carrying wires.

A further object of the invention is to provide a method of making parallel, minute passages in epoxy for accommodating wires, and the product produced by this method.

Other objects, advantages, and novel features of the invention will become apparent from the following detailed description thereof when considered in conjunction with the accompanying drawings in which like numerals represent like parts throughout and wherein.

Figure 1:
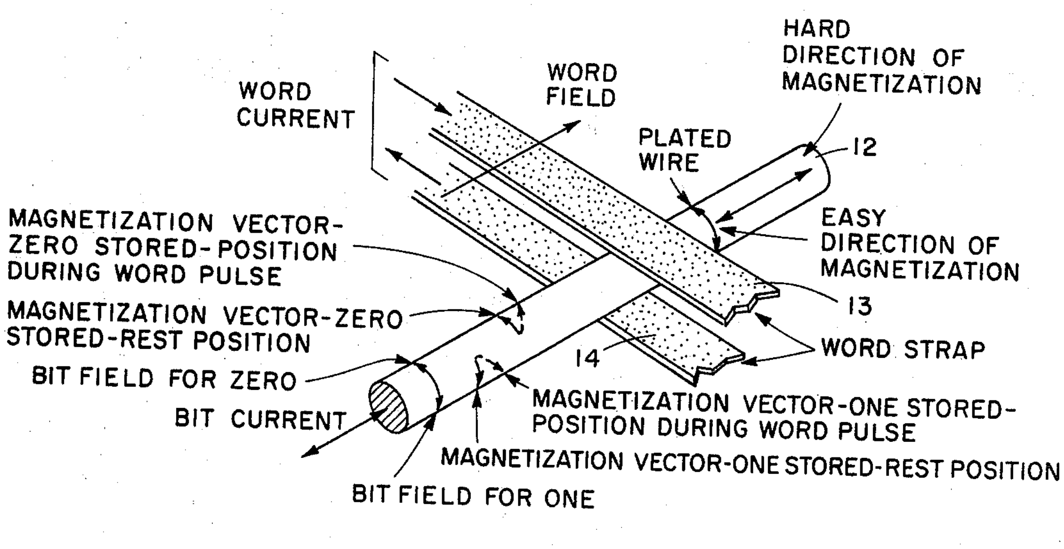
FIG. 1 is a schematic diagram illustrating the operation of a plated wire memory device.

Referring to FIG. 1, the mode of operation of a plated wire memory system is diagramatically presented and includes a plated wire 12 which traverses preferably the longitudinal dimension of a memory plane and a pair of word carrying strips 13 and 14 which are disposed on the outer surface of the memory plane transverse to the direction of plated wire 12 for carrying word current to and from the plated wire. This view illustrates how the plated wire is magnetized and thus emphasizes the necessity for assuring that this wire is inserted into its appropriate tunnel in the word plane in such a manner that the coating on the wire is not disturbed. In the present invention, a plurality of plated wires 12, 5 mils in diameter, are to be disposed in parallel relationship in the memory plane spaced 25 mils apart on their center. Each wire is inserted in a hole having a diameter of 6 mils, which hole is the tunnel formed by the process of the present invention. The tunnels preferably are 8 inches in length for the present embodiment, and the board in which the tunnels are disposed is 12 mils thick.

Figure 2:
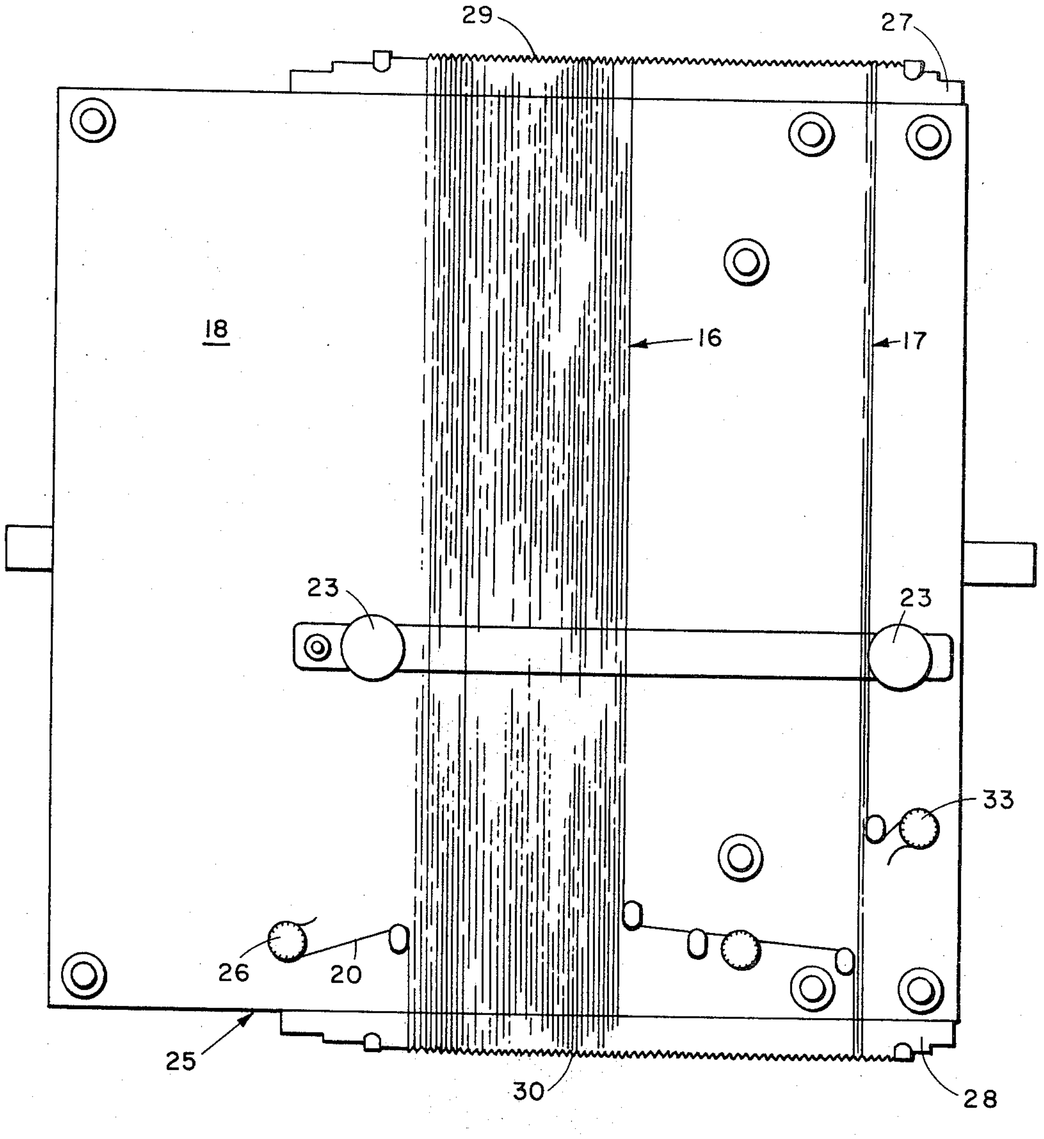
FIG. 2 is a plan view showing means for defining the tunnels formed in the epoxy.

FIG. 2 shows an arrangement of the components used in forming arrays of tunnel-forming tooling wires 16 and 17 in a plane a selected distance above a sheet 18 forming the bottom of a memory plane. A single wire 20 is unwound from a wire spool, not shown, by a wire winding machine, not shown, with the wire then passing through a greasing mechanism, also not shown, and thereafter threaded around two plastic rollers 22 and 23 on a tensioning frame 24 and a winding plate 25 after being secured in a fastener 26. Tension on wire 20 is adjusted to the appropriate tension by a conventional gage, not shown, and thereafter the greased wire is wound over end members 27 and 28 successively in grooves 29 and 30 therein. When windings fill each successive groove in ends 27 and 28, the other end of the wire is wound around and secured to a fastener 33 on the assembly 25.

Figure 3:
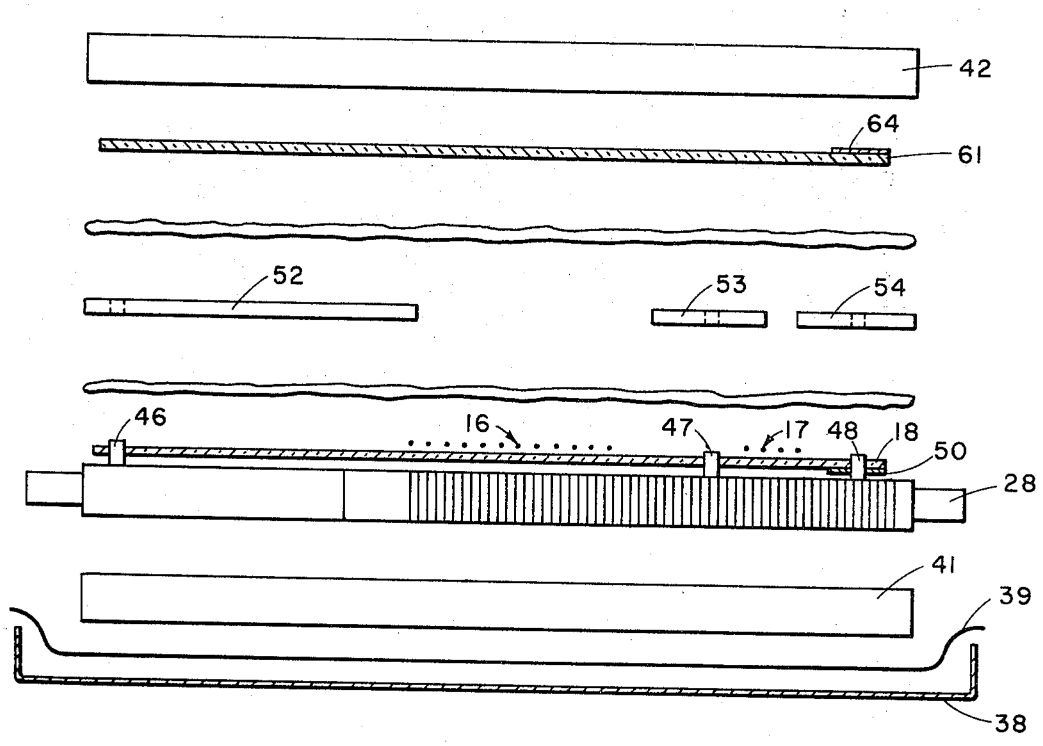
FIG. 3 is an exploded view of the components used in practicing the method of the invention.
Figure 4:
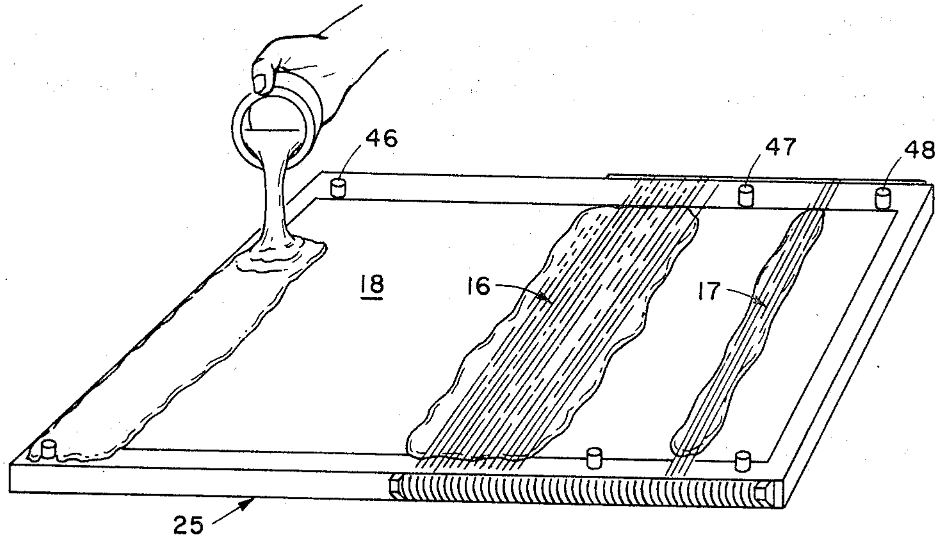
FIG. 4 is a perspective view illustrating the initial steps in performing the method of the invention.

FIG. 3 shows schematically the components which are used to form a memory plane in a side elevation, which components comprise an aluminum tray 38 which is flanged on all four sides and in which is disposed a Teflon sheet 39 preferably 6 mils thick which is sufficiently large to extend over all edges of tray 38. Aluminum tray 38 is flanged on all four sides to retain in Teflon sheet 39 any liquids which may escape during the performance of the process. The wires in arrays 16 and 17, which are seen in section only in this view, are sprayed with a conventional fluorocarbon mold release after they have been brushed gently with a suitable fine toothbrush to remove excess grease. A pair of laminating plates 41 and 42 are completely and liberally painted with a suitable liquid release so that epoxy will not adhere to these plates. Bottom sheet 18, having Tedlar on the upper side only, is then positioned on frame 25 under wire arrays 16 and 17 and within a plurality of pins 46, 47 and 48. Bottom sheet 18 preferably is made of semi-rigid epoxy material of similar composition to that of the two-part liquid epoxy which will be used later in the process. This sheet, and a companion sheet to be described later to form the top of the plane, preferably are provided with a copper strip along the edge indicated at 50 nearest the viewer for purposes related to the use of the memory plane and not to the process of forming tunnels therein.

FIGS. 4 through 8 show various successive steps in applying a pre-mixed two-part epoxy resin to the various layers to form the memory plane. The liquid epoxy resin to be applied is preferably first mixed and then divided into two approximately equal volumes in separate containers. The containers then are preferably placed in a vacuum chamber and the chamber evacuated until bubbles in the resin crest and then collapse. Thereafter, the resin is allowed to boil for from 20 to 30 seconds after which the vacuum pump is turned off and the air valve to the chamber opened. If any bubbles are still present, they are removed by re-evacuating the chamber.

Figure 5:
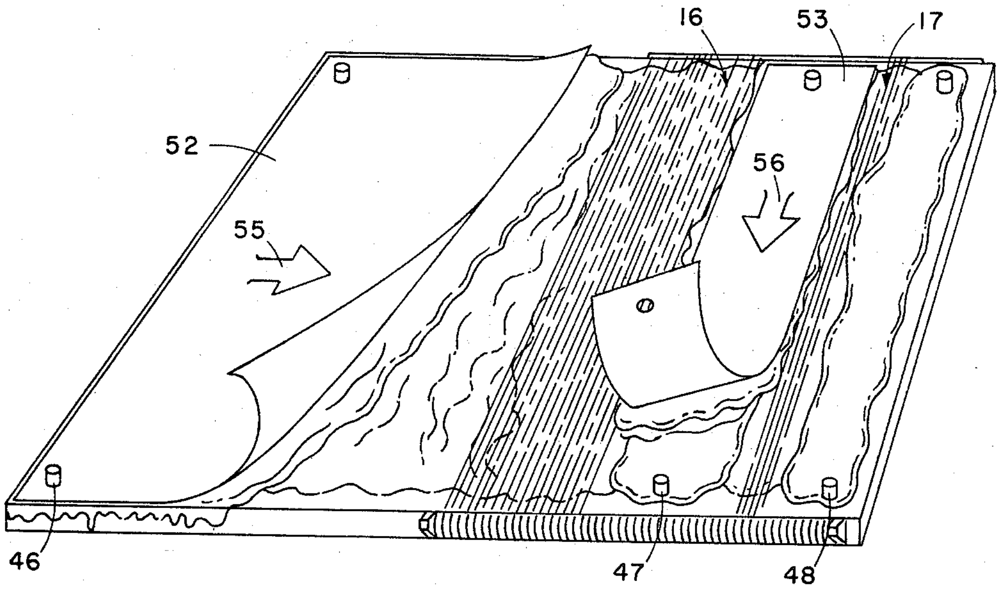
FIG. 5 is a perspective view showing steps subsequent to those shown in FIG. 4.
Figure 6:
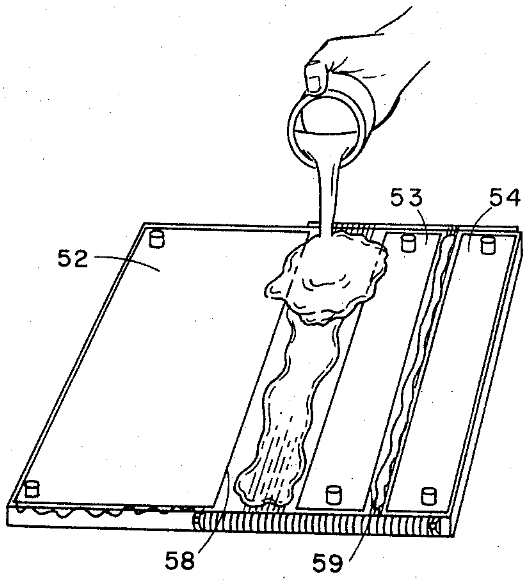
FIG. 6 is a perspective view showing further steps in the method.
Figure 7:
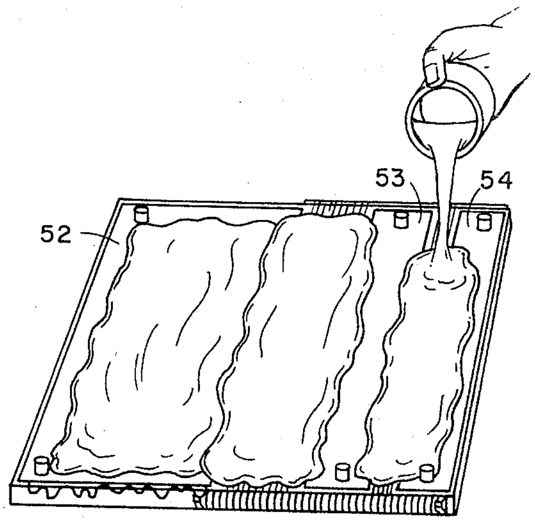
FIG. 7 is a perspective view showing still further steps in the method.
Figure 8:
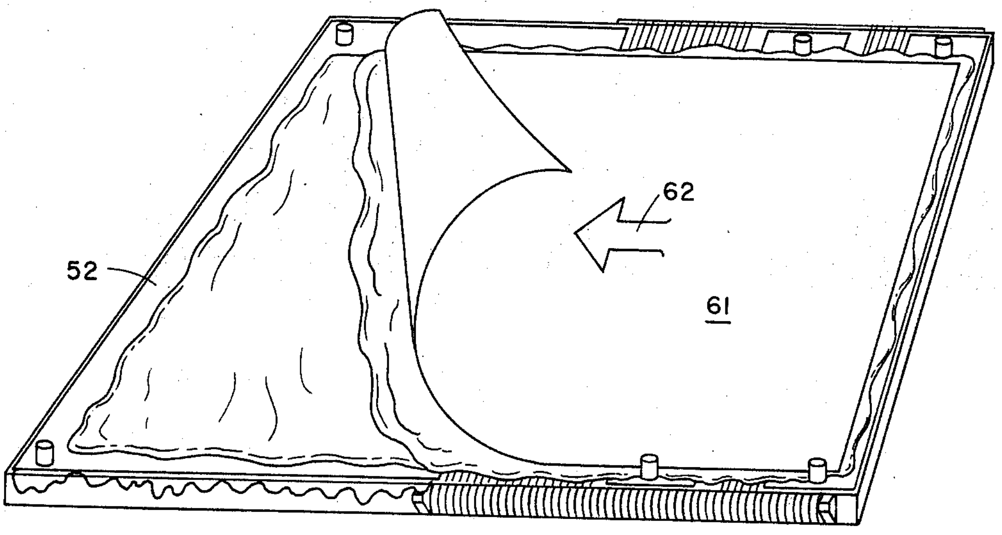
FIG. 8 is a perspective view showing the final steps in the method.

The tooling wires in arrays 16 and 17 are brushed gently with a suitable fine bristle toothbrush to remove excess grease and then these wires are sprayed with a fluorocarbon mold release along their entire length before epoxy sheet 18 is inserted in the position shown in FIG. 3. It is important to be sure that no spray comes in contact with bottom sheet 18. At this point, the epoxy from one cup is applied in the manner shown in FIGS. 4 and 5, that is, epoxy is first poured over the wires in arrays 16 and 17, and while this epoxy is settling, epoxy is poured over the uncovered portions of bottom sheet 18. When the entire surface of sheet 18 has been covered to a uniform depth, which preferably brings the epoxy coating into contact with the bottom surfaces of the wires in arrays 16 and 17, strips of sheet epoxy material indicated at 52, 53 and 54 in FIGS. 5 and 6 are positioned over pins 46 – 48 and these sheets are pressed in place by applying pressure evenly beginning at the edges of the strips as indicated by arrows 55 and 56. When all strip sheets are in place between and alongside wire arrays 16 and 17, additional epoxy is applied as indicated in FIG. 6 to the areas between the strips as indicated at 58 and 59 until the epoxy at least reaches the upper surfaces of the strips. Thereafter, as shown in FIG. 7, additional epoxy from the second cup is poured over all of the sheets and spaces to a selected depth or in a selected amount after which a top sheet of semi-rigid epoxy material 61 is laid in place in the direction indicated by arrow 62. It is noted that top sheet 61 has had previously applied thereto a copper strip 64 which extends along its upper edge directly opposite strip 50 on the lower edge of bottom sheet 18.

Referring again to FIG. 3, after top sheet 61 has been smoothed in place over strips 52, 53 and 54 and the epoxy coating thereon, top plate 42 is positioned in register with top sheet 61 and the entire assembly including tray 38 is placed in a suitable press, not shown, in a chamber, not shown, which may be selectively heated by steam. The temperature in the chamber should be between 70° to 80° F when the assembly is placed therein. Pressure in the chamber is now slowly increased by means of a pre-cure regulator, not shown, until the plates are in intimate contact with their respective adjacent sheets and this pressure is maintained for a period of about 30 seconds and then slowly increased until the pre-cure regulator indicates a pressure of 5,100 lbs has been achieved. In the present embodiment, a period of about 4 to 6 minutes is required to achieve the 5,100-lbs pressure reading. After this pressure has been reached, the steam control is actuated slowly for over a period of from 4 to 8 minutes until the temperature has increased to about 240° to 260° F. At this temperature, the assembly is allowed to cure for from about 85 – 95 minutes after which the steam control is turned off and water is removed from the chamber. The assembly is then allowed to cool to room temperature.

Figure 9:
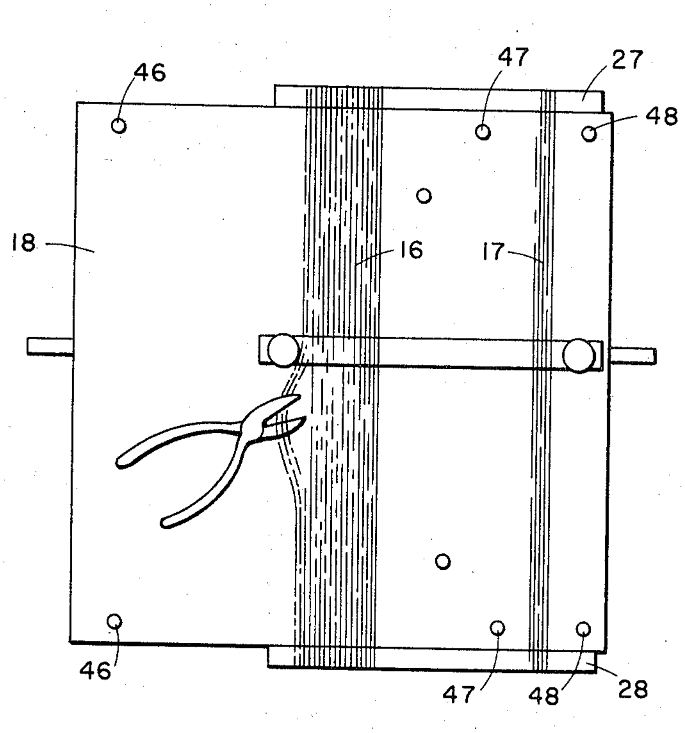
FIG. 9 is a schematic view showing steps in the disassembly of the forming device after the epoxy has hardened.
Figure 11:
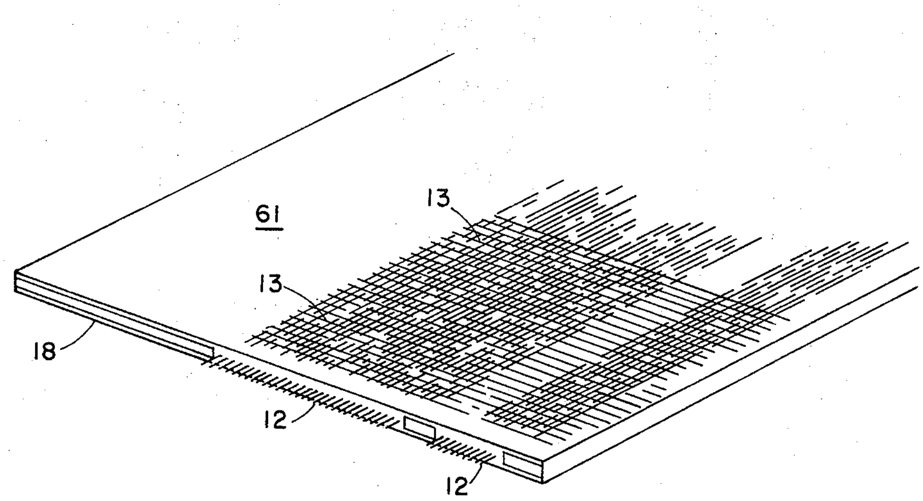
FIG. 11 is a perspective view of the memory portion of memory plane for a plate wire memory stack.

After the epoxy resin in the assembly is cured, disassembly is begun as indicated in FIG. 9 by cutting the wires in arrays 16 and 17 where they are exposed exterior to frame 25 by a wire cutter which may be inserted along the groove of the wire tensioning frame. Next, pins 46, 47 and 48 are removed while holding the fixture so that the top laminating plate is uppermost. The winding plate and the top laminating plate are carefully wedged apart preferably using a short-bladed knife to effect initial separation at the edges. Care should be taken to not allow the full blade of the knife to penetrate between the plates. After plate separation has begun, a slow but steady application of pressure should be used to continue separation. Bending or distortion of the memory plane or word pack should be avoided. Next, both sides of the memory plane are inspected to see if any wires have either been pushed through the copper or made an indentation on the copper, and, if so, special care is taken in the separation of these wires from the copper.

All epoxy is now scraped off of the assembly, that is the top and bottom laminate plates and the winding plate, preferably using a piece of sharpened plexiglas. All epoxy also is removed from the grooves of the tensioning frame by means of a bristle brush if necessary.

Figure 10:
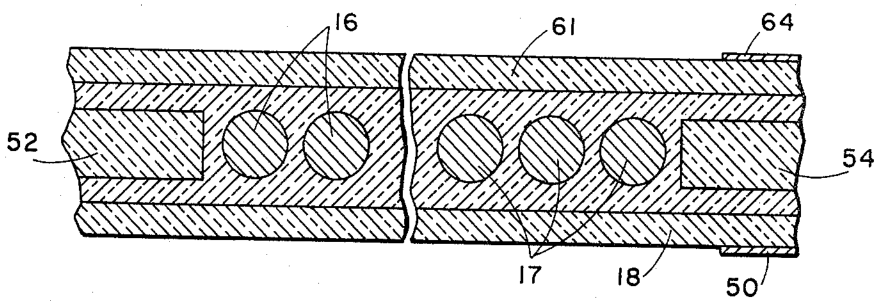
FIG. 10 is a sectional view of the assembled components of the invention.

With the assembly now reduced to a memory plane having Teflon coated, tunnel-forming tooling wires extending therethrough and out opposing sides, the next step is to replace the tooling wires with plated memory wires. The preferred method of installing these plated memory wires is to simply withdraw the tooling wires and then insert plated memory wires of slightly smaller diameter than the tooling wires into the holes or tunnels left by the tooling wires. An alternate method of installation would be to bond or otherwise attach the plated memory wires to the tooling wires before withdrawal of the tooling wires and then to draw the plated wires into respective tunnels in the memory plane. In either method, the surfaces of the tunnels have been pre-lubricated by both the grease applied to the tooling wires and the Teflon coating sprayed thereon after greasing so that the plated memory wires may be installed in the tunnels substantially without any damage to their coating and easily positioned with a selected portion of the wires extending from either side of the memory plane. The memory plane is now in readiness for the plated memory wires to be connected to related circuits in the memory device and for additional printed circuits to be applied as desired to either surface of the memory plane to form a completed memory plane insert. A cross section of a completed memory plane is shown in FIG. 10.

There is thus provided a method of forming minute tunnels of precise dimensions in plastic material having a composite thickness on the order of 12 mils. This is accomplished with a minimum of expensive tooling and has been found to produce memory planes of extremely high quality. Forming tunnels about taut wires assures a far more precise result than forming such tunnels by drilling or other existing methods or means, and at a great savings in material and labor. Removing bubbles from the liquid resin by evacuation of the surrounding air assures at least that there will be no major voids in the cured product. And installing wires having a delicate coating thereon in the tunnels by insertion or by attachment to the slightly larger diameter wires withdrawn therefrom assures to the greatest extent presently known that such coating will not be damaged during installation of the coated wires.

Obviously, many modifications and variations of the present invention are possible in the light of the above teachings. For example, tunnels other than linear may be formed by the process of the present invention, and the process may be applied to producing sheet material having tunnels of much larger size and in material of different composition than those described.

What is claimed is:

1. In an elongated memory plane for a plated wire memory stack, the method of forming a multiplicity of minute passages therein comprising:

laying a bottom sheet of epoxy material on a rigid, flat surface;

coating a plurality of lengths of tooling wire longer than the epoxy sheet with silicone grease;

deploying said lengths of tooling wire in one or more arrays a selected distance above said epoxy sheet with the ends of the wires extending beyond opposing edges of the sheet;

coating said deployed wires with Teflon;

pouring liquid epoxy resin over the bottom sheet and the wires to a depth sufficient to at least partially cover the lower surfaces of the wires;

laying strips of sheet epoxy material over said liquid epoxy resin except in areas where said wire arrays are deployed;

pouring additional liquid epoxy resin over said strips of epoxy and said wire arrays to a selected level above said bottom sheet;

laying a top sheet of epoxy material on said additional epoxy resin;

curing said epoxy resin at elevated temperature and under selected pressure on said top sheet;

trimming excess epoxy from the cured assembly;

withdrawing said tooling wires from said assembly; and inserting plated memory wires into respective tunnels formed by said tooling wires.

2. The method as defined in claim 1 wherein said plated memory wires are installed in said memory plane by attachment to said tooling wires before the tooling wires are withdrawn.

3. The method as defined in claim 1 and further including registering each sheet of epoxy material over means which are common to all layers of material.

4. The method as defined in claim 3 wherein the spaces occupied by said arrays of tooling wires are first filled up to the level of said strips of material.

5. The method as defined in claim 4 and further including removing bubbles from said epoxy resin before pouring by maintaining said resin in a vacuum chamber until all bubbles therein have crested and then collapsed.

6. The method as defined in claim 5 and further including boiling said resin in the vacuum chamber for a period on the order of from 20 to 30 seconds after the bubbles have collapsed before removal therefrom.

7. The method as defined in claim 6 and further including spreading the epoxy resin over the tooling wires and the sheet epoxy material by brush; and perforating bubbles which occur with the brush until the bubbles break.

8. The method as defined in claim 7 and further including positioning the tooling wires under tension across and above the bottom sheet as the initial step in the method.

9. The method as defined in claim 8 wherein the tooling wires are placed under tension by winding a single length of wire in a plurality of turns about a winding plate which supports the bottom sheet.

10. The method as defined in claim 9 wherein the tooling wires are spaced selectively apart by grooves formed in edge pieces of the winding plate.

11. The process of forming precisely defined tunnels in resinous material comprising:

placing a plurality of liquid release coated wires in tension in a selected relationship with an underlying surface formed of resinous material;

pouring a liquid resin over the surface to at least the level of the wires;

defining a cavity for the wires by surrounding the area in which they are disposed with sheet resin material;

pouring additional liquid resin over the sheet resin and the wires;

placing an overlay surface of resinous material on the additional liquid resin;

compressing the underlying and overlay surfaces together under evenly applied selected pressure;

curing the assembly of wires, surfaces and liquid resin;

removing excess cured resin; and withdrawing the wires.

12. The process as defined in claim 11 wherein the wires are attached at adjacent ends to the ends of replacement wires so that the replacement wires are disposed in the tunnels formed by the first wires upon withdrawal of the first wires.

* * * * *